United States Patent [19]
Hayes et al.

[11] Patent Number: 5,329,255
[45] Date of Patent: Jul. 12, 1994

[54] THERMALLY COMPENSATING MICROWAVE CAVITY

[75] Inventors: James R. Hayes, Torrance; Steve R. Kasten, Carson; George J. Purden, Gardena, all of Calif.

[73] Assignee: TRW Inc., Redondo Beach, Calif.

[21] Appl. No.: 940,580

[22] Filed: Sep. 4, 1992

[51] Int. Cl.⁵ .................. H03B 5/04; H03B 5/18; H03B 7/12; H03B 7/14
[52] U.S. Cl. ...................... 331/96; 331/107 DP; 331/176; 333/229; 333/233
[58] Field of Search ............. 331/68, 69, 96, 107 DP, 331/176, 117 D; 333/229, 231, 232, 233

[56] References Cited

U.S. PATENT DOCUMENTS

| | | |
|---|---|---|
| 1,790,761 | 2/1931 | Ortolon . |
| 2,996,690 | 8/1961 | St. Clair .................. 333/229 |
| 3,048,803 | 8/1962 | Schanbacher . |
| 3,108,240 | 10/1963 | Riblet . |
| 3,160,825 | 12/1964 | Derr . |
| 3,623,146 | 11/1971 | Kaneko et al. . |
| 3,665,341 | 5/1972 | Sekine et al. . |
| 3,714,606 | 1/1973 | Friend . |
| 4,011,527 | 3/1977 | Havens . |
| 4,019,161 | 4/1977 | Kimura et al. . |
| 4,041,416 | 8/1977 | Glance .................. 331/176 X |
| 4,059,815 | 11/1977 | Makimoto et al. . |
| 4,127,834 | 11/1978 | Stringfellow et al. . |
| 4,156,860 | 5/1979 | Atia et al. . |
| 4,521,754 | 6/1985 | Ranghelli et al. . |
| 4,618,836 | 10/1986 | Gannon et al. . |
| 4,766,398 | 8/1988 | Kiedrowski . |

FOREIGN PATENT DOCUMENTS 2327362 1/1975 Fed. Rep. of Germany ...... 333/229

OTHER PUBLICATIONS

"Circuit Characterization of V-Band IMPATT Oscillators and Amplifiers", T. T. Fong, Kenneth P. Weller, David L. English, *IEEE Transactions on Microwave Theory and Techniques.* vol. MTT-24, No. 11, Nov. 1976.

*Primary Examiner*—David Mis

[57] ABSTRACT

A thermally compensating microwave cavity is provided. An active device that generates microwaves is disposed within this microwave cavity such that microwaves are emitted within the cavity. A first portion of these microwaves travels in one direction from the active device and forms a broad bandwidth signal. A section portion of the microwaves travels toward a reflecting member and is reflected. Once reflected, this second portion combines with and compensates the first portion. A temperature dependent bellows is utilized to displace the active device and the reflecting member relative to one another. Accordingly, as the signal emitted by the active device changes with temperature, the reflecting member is displaced by the bellows to properly reflect the second portion of the microwaves such that it combines with and properly compensates the signal.

16 Claims, 1 Drawing Sheet

THERMALLY COMPENSATING MICROWAVE CAVITY

BACKGROUND OF THE INVENTION

1. Technical Field

This invention relates generally to a microwave cavity and, more particularly, to a broad bandwidth cavity that is thermally compensated.

2. Discussion

Microwave cavities have been thermally compensated as generally disclosed in U.S. Pat. No. 3,665,341 issued to Sekine et al., May 23, 1972, which is incorporated herein by reference. Generally, when the temperature of these types of devices is changed, the impedance of an oscillator within the device changes. Changes in oscillator impedance cause the frequency of the microwave signal emanating from the microwave cavity to distort. One solution to such signal variation is to combine reflected microwaves with the signal to compensate the signal distortion. Accordingly, the oscillator emits microwaves within the microwave cavity both toward and away from a waveguide coupled to the cavity. The microwaves traveling away from the waveguide are reflected to combine with and compensate the microwaves already traveling toward the waveguide. This combination of microwaves forms a compensated signal that enters the waveguide.

To properly compensate the distorted frequency of the signal, reflected microwaves must have the correct phase shift. This phase shift is determined by the distance between the oscillator and the reflective member. Thus, the distance between the reflective member and the oscillator must always be such that the reflected microwaves properly compensate for frequency distortions due to specific changes in oscillator temperature. Accordingly, an expanding and contracting member having a certain thermal expansion co-efficient is utilized. The expansion co-efficient is selected to provide precise displacement of the reflective member over a range of operating temperatures. This precise displacement ensures that the proper phase shift of the reflected microwaves is achieved to properly compensate the signal over the range of operating temperatures.

These types of temperature compensated cavities have been generally adequate for compensating high Q, relatively narrow bandwidth oscillators. However, high Q, relatively narrow bandwidth oscillators generally do not permit a high rate data link. In particular, these types of thermally compensated systems will not provide a radar system with fine range resolution. Accordingly, it would be desirable to provide a thermally compensated device for a low Q, relatively broad bandwidth oscillator.

In order to properly compensate a low Q relatively broad bandwidth oscillator, the displacement of the expanding and contracting reflective member must be generally greater than the displacement of relatively narrow bandwidth, high Q microwave cavities described above. Accordingly, it would be desirable to provide an expanding and contracting reflective member that is compact in size and capable of providing generally greater displacement of a reflective member.

SUMMARY OF THE INVENTION

This invention provides a temperature compensated, low Q broad bandwidth microwave cavity that compensates for changes in an active device's frequency due to temperature changes in the active device. To accomplish this compensation, a bellows having a certain thermal expansion co-efficient is utilized. This bellows is coupled to a reflective member such that as the entire system changes temperature, and the frequency of the active device changes, the bellows expands or contracts to move the reflective member an appropriate distance from the active device. When the reflective member is properly spaced from the active device, microwaves reflected off the reflective member will combine with and compensate microwaves emanating from the active device. These compensated microwaves form a signal having the proper frequency as they enter a waveguide.

Thus, one advantage of the present invention is its ability to compensate a relatively broad bandwidth signal.

Another advantage of the present invention is its ability to provide a relatively large amount of displacement of a reflective member, thereby being able to compensate a low Q signal.

Yet another advantage of the present invention is the compactness of the device.

These and other advantages of the present invention will become apparent in view of the specification, claims and subjoined drawings.

DETAILED DESCRIPTION OF THE PREFERRED EMBODIMENT

Figure 1:
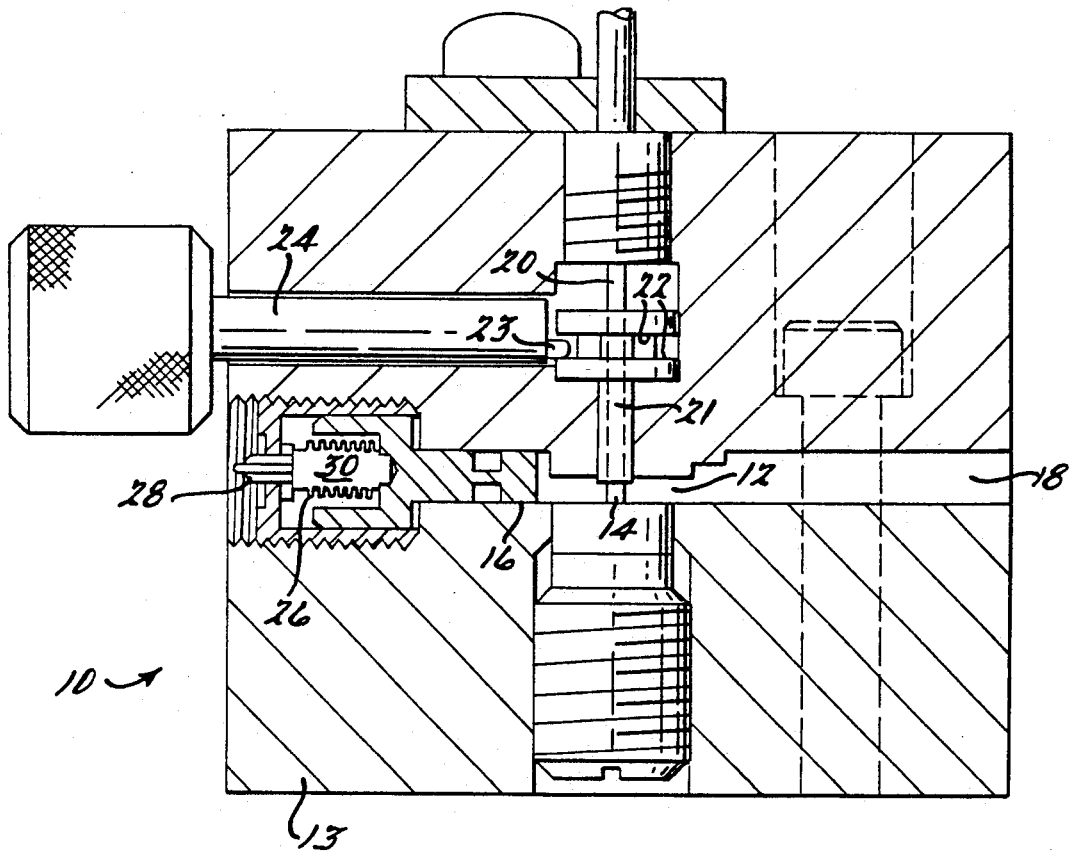
FIG. 1 is a cross sectional view of the temperature compensated microwave cavity of the present invention illustrating the reflective member disposed within the microwave cavity and coupled to the bellows.

Referring now to the drawings, and in particular FIG. 1, a temperature compensating device 10 for compensating a microwave cavity 12 within a housing 13 is shown. Generally, the thermally compensated device 10 utilizes an active device 14, disposed within the microwave cavity 12, to generate a relatively broad bandwidth microwave signal. This broad bandwidth microwave signal travels within the microwave cavity 12 to the right, as oriented in FIG. 1. A second portion of the microwaves being generated by the active device 14 travels to the left and strikes a reflective member 16 at the left most end of the cavity 12. This second portion of microwaves sees the reflective member 16 as a short circuit and therefore reflects off the reflective member 16 and travels to the right. The reflected microwaves then combine with the microwave signal already travelling to the right, thereby forming a compensated broad bandwidth signal that leaves the cavity 12 and enters the waveguide 18.

The embodiment depicted in FIG. 1 preferably utilizes an IMPATT diode as an active device 14, however, other types of active devices such as Gunn diodes and the like may also be utilized. A voltage is applied to the IMPATT diode via the coaxial structure inner conductor 20 entering through the upper portion of the microwave cavity 12 as shown in FIG. 1. When a voltage is applied to the IMPATT diode, it emits a low Q, broad bandwidth signal toward the waveguide 18. Note, to ensure the proper frequency signal is transmitted through the waveguide 18, a conventional tuning rod 21 extends along the aforementioned coaxial structure into the microwave cavity 12. This tuning rod 21 is tubular such that it surrounds the inner conductor 20 of the coaxial structure. The tuning rod 21 has a head portion with two follower surfaces 22 that are cammed up and down by a camming nub 23. This camming nub 23 extends slightly off center from a central axial axis of a tuning tool 24 such that as the tuning tool 24 is turned, the nub 23 cams the tuning rod 21 up and down, into and out of the microwave cavity 12. Thus, at normal operating temperature, the microwave signal generated by the IMPATT diode is tuned to have the proper frequency when it enters the waveguide 18. However, when the temperature of the IMPATT diode is changed, the impedance of the IMPATT diode changes, thereby changing the frequency of the microwave signal being generated. To compensate for this distortion of the signal, a reflective member 16 is utilized in accordance with the principles of the present invention.

In order to properly compensate for distortion in the frequency of the signal, phase shifted microwaves can be combined with the distorted signal to form a compensated signal. To phase shift a portion of the microwaves, microwaves are emanated from the active device 14 to the left, as oriented in FIG. 1, and reflected off a reflective member 16. To achieve the proper phase shift, the reflective member 16 must be the proper distance from the active device 14 which is stationary. For example, if the temperature of the active device 14 is lowered and the bandwidth of the signal consequently distorts, the reflective member 16 must be the proper distance from the active device 14 to appropriately phase shift the reflected microwaves to compensate for the exact amount of distortion. In short, the phase shift in the reflected microwaves necessary to compensate a distorted signal is dependant on displacement of the reflective member 16. To accomplish a sufficient amount of displacement of the reflective member 16, a unique compact expandable and contractible bellows 26 is coupled to the reflective member 16. In the preferred embodiment, this compact bellows 26 is made of electroformed nickel and is soldered to a copper charging adapter 28 and is filled with a silicone material 30 known as 1.5 centistokes dimethylpolysiloxane (Dow Corning 200 fluid). Despite its compactness, the configuration of this particular bellows 26 provides an overall displacement substantially greater than 0.003 inches, which is necessary to thermally compensate a broad bandwidth, low Q microwave cavity, and a displacement rate of 0.000019 thousandths of an inch per 1.0 F.° change in temperature. This rate of displacement is sufficient to provide the proper phase shift to thermally compensate broad bandwidth, low Q signals from the active device 14 in the range of about $-31°$ F. to $+150°$ F. One of ordinary skill in the art would certainly recognize that a bellows in accordance with the principles of the present invention could be made of and filled with any number of materials having the appropriate design characteristics, including an appropriate thermal expansion coefficient for any number of temperature ranges.

Figure 2:
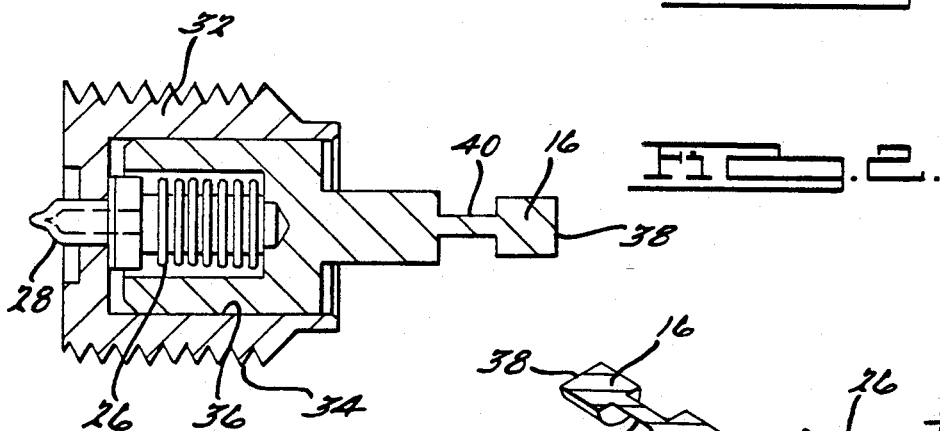
FIG. 2 is a cross sectional view of the reflective member slidingly engaged with the attaching member, and the bellows and charging adapter disposed therebetween.
Figure 3:
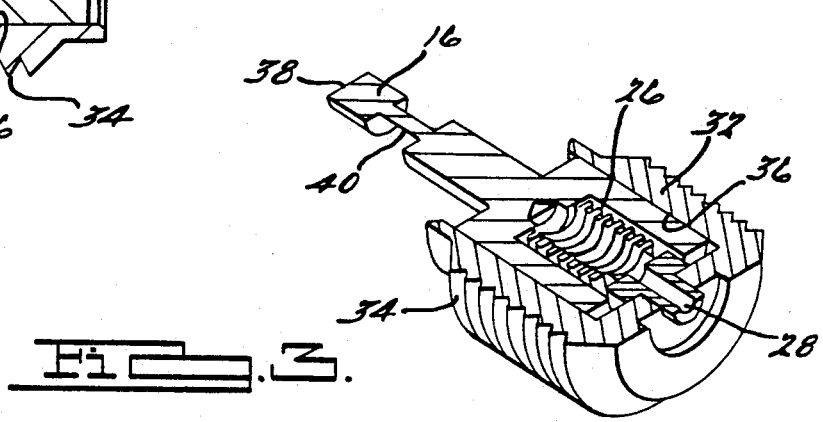
FIG. 3 is a perspective view of the attaching member and reflective member shown in FIG. 2 further illustrating the reflective member being slidingly engaged with the attaching member.

As shown in FIGS. 2 and 3 the bellows 26 is coupled to both the reflective member 16 and to an attaching member 32 that fixedly attaches to the microwave cavity housing 13. In the preferred embodiment, the outer portion 34 of the attaching member 32 is threaded such that it is easily attached, detached and adjusted with respect to the microwave cavity 12, thereby easing installation and maintenance. The reflective member 16 slidingly engages with an inner surface 36 of the attaching member 32 such that proper orientation of the reflective member 16 is maintained as it is displaced within the microwave cavity 12. When the bellows 26 expands and contracts, the reflective member 16 is slidingly displaced within the attaching member 32 relative to the active device 14, which is rigidly affixed within the cavity 12. Note that the distal end 38 of the reflective member 16 closest to the active device 14 is connected by a smaller diameter neck portion 40. This particular shape is utilized because of the high efficiency reflection characteristic of a classical "filter type" noncontacting backshort. Such a shape is conventional within this field of art and one of ordinary skill in this art would certainly recognize that other conventionally shaped reflective members can be utilized.

In short, the use of this unique bellows 26 provides the accurate and sufficient displacement necessary to thermally compensate a broad bandwidth microwave cavity. Previously known displacing devices have only been capable of thermally compensating High Q, narrow bandwidth microwave cavities. The relatively large amount of displacement and the compact design of bellows of the present invention defeats these shortcomings and provides compensation over a large temperature range.

Although the invention has been described and illustrated in connection with certain preferred embodiments, there are variations and modifications that can be affected within the spirit and scope of the invention. Therefore, the invention as set forth in the following claims is not to be limited to the precise details of construction set forth above.

We claim:

1. A thermally compensating microwave cavity for compensating microwaves passing through said microwave cavity such that a compensated microwave signal is emitted from said cavity, said microwave cavity comprising:

a) at least one member defining a broad bandwidth microwave cavity;

b) generating means for generating microwaves within said microwave cavity such that a first portion of said microwaves, traveling in one direction from said generating means, form a broad bandwidth signal that passes through said microwave cavity;

c) reflecting means for reflecting a second portion of said microwaves, traveling in another direction from said generating means, such that said second portion of microwaves is reflected to combine with and compensate said broadband signal formed by said first portion; and d) temperature dependent displacing means having a generally hollow expandable member with a fluid material disposed therein that expands and contracts as a result of temperature change, said expandable member operable for causing said reflecting means and said generating means to move relative to one another, as said fluid material expands and contracts, to compensate for changes in said broad bandwidth signal occurring as a result of said temperature change.

2. The thermally compensating microwave cavity of claim 1 wherein said generating means for generating microwaves is an active device.

3. The thermally compensating microwave cavity of claim 1 wherein said hollow expandable member is a bellows that expands and contracts as a result of temperature changes.

4. The thermally compensating microwave cavity of claim 3 wherein said bellows is filled with a silicone material.

5. The thermally compensating microwave cavity of claim 1 wherein said displacing means displaces said reflecting means a distance substantially greater than 0.003 inches.

6. The thermally compensating microwave cavity of claim 1 wherein said generating means is stationary and said reflecting means is displaced relative to said generating means.

7. The thermally compensating microwave cavity of claim 1 wherein said reflecting means and said displacing means are coupled to an attaching means such that said reflecting means and said displacing means can be removably attached as a unit to said member defining said microwave cavity.

8. The thermally compensating microwave cavity of claim 7 wherein said reflecting means is slidingly engaged with said attaching means.

9. The thermally compensating microwave cavity of claim 1 wherein said generating means for generating microwaves within said microwave cavity is an IMPATT diode.

10. A temperature compensating device for compensating microwaves passing through a microwave cavity such that a compensated microwave signal is emitted from said cavity, said device comprising:
a) at least one member defining a broad bandwidth microwave cavity;
b) an active device, that is stationary relative to said member, that generates microwaves within said microwave cavity such that a first portion of said microwaves travels through said cavity away from said active device and a second portion of said microwaves travels through said cavity away from said active device in an opposite direction;
c) reflecting means disposed within said cavity for reflecting said second portion of said microwaves such that said second portion combines with said first portion to form a thermally compensated signal; and
d) an expandable and contractible bellows having a thermal expansion coefficient, said bellows operably associated with said reflecting means for moving said reflecting means relative to the active device as said bellows expands and contracts with changes in temperature.

11. The temperature compensating device of claim 10 wherein said bellows is filled with a silicone material.

12. The temperature compensating device of claim 10 wherein said bellows displaces said reflecting means a distance substantially greater than 0.003 inches.

13. The temperature compensating device of claim 10 wherein said reflecting means and said bellows are coupled to an attaching member such that said reflecting means and said bellows can be removably attached as a unit to said microwave cavity.

14. The temperature compensating device of claim 10 wherein said reflecting means is slidingly engaged with said attaching member.

15. The temperature compensating device of claim 10 wherein said active device within said microwave cavity is an IMPATT diode.

16. The temperature compensating device for compensating microwaves passing through a microwave cavity such that a compensated microwave signal is emitted from said cavity, said device comprising:
a) at least one member defining a broad bandwidth microwave cavity;
b) generating means for generating microwaves within said microwave cavity such that a first portion of said microwaves, traveling in one direction from said generating means, form a broad bandwidth signal that passes through said microwave cavity;
c) reflecting means for reflecting a second portion of said microwaves, traveling in another direction from said generating means, such that said second portion of microwaves is reflected to combine with and compensate said broadband signal formed by said first portion; and
d) temperature dependent displacing means for displacing said reflecting means and said generating means relative to one another, said reflecting means and said displacing means being coupled to an attaching means such that said reflecting means and said displacing means can be removably attached as a unit to said member defining said microwave cavity, said reflecting means slidingly engaging said attaching means as a result of temperature changes in said temperature dependent displacing means, thereby positioning said reflecting means to compensate for changes in said broad bandwidth signal as a result of temperature changes in said generating means.

* * * * *